(12) United States Patent
Olarig et al.

(10) Patent No.: US 6,493,836 B2
(45) Date of Patent: *Dec. 10, 2002

(54) METHOD AND APPARATUS FOR SCHEDULING AND USING MEMORY CALIBRATIONS TO REDUCE MEMORY ERRORS IN HIGH SPEED MEMORY DEVICES

(75) Inventors: Sompong P. Olarig, Cypress, TX (US); John E. Jenne, Houston, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 171 days.

This patent is subject to a terminal disclaimer.

(21) Appl. No.: 09/726,738

(22) Filed: Nov. 30, 2000

(65) Prior Publication Data

US 2002/0066052 A1 May 30, 2002

(51) Int. Cl.[7] .................. G06F 11/30; G11C 11/4193
(52) U.S. Cl. ............................... 714/42; 711/105
(58) Field of Search ........................... 711/105; 714/42

(56) References Cited

U.S. PATENT DOCUMENTS 5,084,791 A * 1/1992 Thanos et al. ........... 360/77.04
6,373,768 B2 * 4/2002 Woo et al. ................. 365/211

OTHER PUBLICATIONS

*Direct Rambus™RIMM™ Module Specification Version 1.0*, Rambus Inc., SL–0006–100 (32 p.), 200.
*Rambus®RIMM™Module* (*with 128/144Mb RDRAMs*), Preliminary Information, Document DL0084 Version 1.1 (12 p.).
*Direct RDRAM™256/288–Mbit* (*512Kx16/18x32s*), Preliminary Information Document, DL0060, Version 1.01 (69 p.).

* cited by examiner

*Primary Examiner*—David L. Robertson
(74) *Attorney, Agent, or Firm*—Conley, Rose & Tayon, P.C.; Michael F. Heim

(57) ABSTRACT

A computer system with high-speed memory devices includes error checking logic that monitors the number and/or frequency of memory errors. The number and/or frequency of soft memory errors is provided to control logic in a memory controller, which intelligently modifies the frequency of memory calibration cycles based on the detected memory errors. Thus, in response to an unacceptable number of memory errors, the memory controller may increase the frequency of calibration cycles. The memory controller may include error checking logic that monitors memory errors on multiple memory channels, if multiple memory channel are provided, to enable the memory controller to modify calibration frequency on a channel-by-channel basis.

33 Claims, 7 Drawing Sheets

METHOD AND APPARATUS FOR SCHEDULING AND USING MEMORY CALIBRATIONS TO REDUCE MEMORY ERRORS IN HIGH SPEED MEMORY DEVICES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to memory systems that include high speed memory devices. More particularly, the present invention relates to memory systems, such as Direct Rambus Dynamic Random Access Memory (RDRAM), that require calibration cycles to insure proper operation. Still more particularly, the present invention relates to a memory system that includes error checking and correction logic, and which adjusts the frequency of calibration cycles based on the number of memory errors detected by the error correction and checking logic.

2. Background of the Invention

Almost all computer systems include a processor and a system memory. The system memory functions as the working memory of the computer system, where data is stored that has been or will be used by the processor and other system components. The system memory typically includes banks of dynamic random access memory (DRAM) circuits. According to normal convention, a memory controller interfaces the processor to a memory bus that connects electrically to the DRAM circuits. While DRAM circuits have become increasingly faster, the speed of memory systems typically lags behind the speed of the processor. Because of the large quantity of data that is stored in the system memory, it may at times be a bottleneck that slows down the performance of the computer system. Because of this disparity in speed, in most computer systems the processor must wait for data to be stored ("written") and retrieved ("read") from DRAM memory. The more wait states that a processor encounters, the slower the performance of the computer system.

The main memory provides storage for a large number of instructions and/or a large amount of data for use by the processor, providing faster access to the instructions and/or data than would otherwise be achieved if the processor were forced to retrieve data from a disk or drive. However, the access times of conventional RAMs are significantly longer than the clock cycle period of modem processors. To minimize the latency of the system, various high-speed memory devices have been introduced to the market. An example of such a high-speed memory device is the Direct RDRAM device developed by Rambus. See "RAMBUS Preliminary Information Direct RDRAM™", Document DL0060 Version 1.01; "Direct Rambus™ RIMM™ Module Specification Version 1.0", Document SL-0006-100; "Rambus® RIMM™ Module (with 128/144 Mb RDRAMs)" Document DL00084, Version 1.1, which are incorporated by reference herein. As indicated in the Rambus specifications, the Direct RDRAM memory is capable of transferring 1.6 GB per second per DRAM device.

Each Direct RDRAM device typically includes 32 banks, with 512 rows per bank, although other size RDRAM devices may be available. Depending on the size of the RDRAM device, each row (or page) typically has either 1 kilobyte or 2 kilobytes of memory storage capability. The Direct RDRAM devices are arranged in channels, with each channel currently capable of supporting up to 16 Direct RDRAM devices. One or more Direct RDRAM devices may be packaged in Rambus In-line Memory Modules (RJMMs). Multiple channels may be provided in a computer system to expand the memory capabilities of the system.

While Direct RDRAM and similar memory devices are theoretically capable of operating at very high speeds, they exhibit certain severe operating constraints that can significantly degrade performance. To achieve the high operational speeds, the memory devices have very precise timing requirements, with very little margin or tolerance for deviation. Parameters for read transactions will be discussed briefly to illustrate some of the timing issues.

As shown in FIG. 1, the Direct RDRAM couples to a memory controller (which includes a Rambus ASIC Cell or "RAC") via two clock signal lines, three Row signal lines, five Column signal lines, and two data busses. The clock lines include a Clock-to-Master (CTM) line, and a Clock-from-Master (CFM) line that are used to synchronize signals to the memory controller and from the memory controller, respectively. The Row signal lines and Column signal lines form part of a control and address bus (RQ bus) that typically includes eight lines. The Row signal lines (ROW2 . . . ROW0) are used primarily to control row accesses in the memory, while the Column signal lines (COL4 . . . COL0) are used primarily to control column accesses. The data busses include a DQA (DQA8 . . . DQ0) and a DQB data bus (DQB8 . . . DQO), that couple to sense amps on opposite sides of the memory banks.

The three Row lines identify which of the 512 possible rows is addressed by presenting nine row bits (R8 . . . R0) in three subsequent half clock cycles ($2^9$=512), as shown in FIG. 2. The device row (DR) bits (DR3 . . . DR0) identify which of the 16 possible memory devices is targeted, while the five Bank row (BR) bits (BR4 . . . BR0) identify which of the 32 banks is targeted in that device. Similarly, and as shown in FIG. 3, the five Column lines identify which of the 64 possible columns is being addressed by presenting 7 column bits (C6 . . . C0) in two subsequent half cycles. The device column (DC) bits (DC4 . . . DC0) identify which of the memory devices is targeted, while the five Bank column (BC) bits (BC4 . . . BC0) identify which of the 32 banks is targeted.

Referring to FIG. 4, a read transaction is performed on a Direct RDRAM device by asserting an Activate command in a ROWA (row activate) packet on the Row signal lines. The Activate command identifies the device, bank and row address of the targeted memory location. A time period $t_{RCD}$ later, a Read command is issued in a Column operation (COLC) packet on the Column signal lines. The Read command identifies the device, bank, and column address of the targeted memory location. Thus, the Activate command and Read command in conjunction identify the specific memory location being accessed, with the Activate command identifying the row, and the Read command identifying the column.

A time period $t_{CAC}$ after the Read command, a read data dualoct (16 bytes) is returned by the targeted memory device. The time period $t_{CAC}$ includes one to five cycles of round-trip propagation delay on the channel. According to current Rambus specifications, the $t_{CAC}$ period may be programmed to a range of values that vary from 7 $t_{CYCLE}$ to 12 $t_{CYCLE}$. The particular value selected for $t_{CAC}$ depends on the number of RDRAM devices on the channel and the RDRAM timing bin so that the round trip propagation delay is equalized for all memory devices. Thus, based on the programmed timing parameters, the memory controller expects that during read cycles, all memory devices will return read data within a specified number of clock cycles after the Read command is asserted. Failure to return data in accordance with these timing parameters will cause data corruption, and may result in failure of the memory system.

The above timing parameters for a read transaction is just one example of the critical nature of timing in a high speed memory device, where the delay of a few nanoseconds can result in poor performance. Unfortunately, high-speed memory devices such as Direct RDRAM have proven highly susceptible to temperature and other environmental conditions such as humidity. If such conditions change during operation, the round-trip propagation delay of the signals propagating between the memory controller and the memory devices will be affected. If the actual propagation delay varies from the programmed delay, data may be corrupted.

In an attempt to resolve operational problems with high speed memory devices such as RDRAM, the memory controller may be designed or programmed to perform certain calibration cycles on a periodic basis. Thus, for example, memory controllers used with Direct RDRAM memory device perform current and temperature calibrations on a periodic basis. For current calibrations, a current calibration cycle is performed to every DRDAM device once every $t_{CCTRL}$ interval to maintain the $I_{OL}$ current output within its proper range. As shown in the example of FIG. 5, four Column extended operation (COLX) packets are asserted by the memory controller with a Calibrate (CAL) command. These Calibrate commands cause the RDRAM to drive four calibration packets Q(a0) a time period $t_{CAC}$ after the CAL command on the DQA4 . . . 3 and DQB4 . . . 3 wires. In addition, the TSQ bit of the INIT register is driven on the DQA5 wire during the same interval as the calibration packets. The TSQ bit indicates when a temperature trip point has been exceeded, as measured by temperature sensing circuitry. The last COLX packet from the memory controller includes a SAM command, concatenated with the last CAL command, that causes the RDRAM to sample the last calibration packet and adjust its $I_{OL}$ current value.

The Calibrate command must be sent on an individual basis to each RDRAM device so that calibration packets from other devices do not interfere with the calibration. Consequently, a current control transaction must be transmitted every $t_{CCTRL}/N$ period, where N represents the number of RDRAMs resident on the channel. After each current calibration transaction, the device field Da of the address a0 in the Calibrate command is incremented.

Temperature calibration similarly is conducted on a periodic basis. As shown in FIG. 6, the temperature calibration sequence is broadcast once every $t_{TEMP}$ interval to all the RDRAMs on the channel. The TCEN and TCAL are row opcode field commands in a ROW operation packet. These commands cause the slew rate of the output drivers to adjust for temperature drift. During the quiet interval, $t_{TCQUIET}$, the devices being calibrated cannot be read, but can receive write transactions.

Thus, while Direct RDRAM is designed to calibrate memory devices based on current and temperature calibrations, these calibrations are performed on a rigid schedule to meet certain minimum timing requirements. In addition, these calibration cycles require long periods of idle time, during which no read cycle is permitted to the memory devices being calibrated. This idle time can add significant latency to any queued read cycles. Currently, the idle time for a Direct RDRAM temperature calibration cycle (the period defined for $t_{TCQUIET}$) is a minimum of 350 ns for a 800 MHz memory device (which is 140 clock cycles).

Because of the sensitively of the high-speed memory devices, many memory controllers are implementing error checking and correction (ECC) logic to improve the reliability of the high-speed memory devices. The ECC logic may be used to monitor the number of soft and hard memory errors that occur during memory operations. In some instances, computer manufacturers may offer warranties which require the manufacturer to replace a memory module when the number of errors exceeds a predefined threshold. Because of the sensitivity of the high-speed memory modules, the number of memory errors may be due to clock skew errors that result from environmental conditions. Thus, memory modules may be replaced unnecessarily because of excessive errors that result from changing environmental conditions. In addition, the high occurrence of memory errors may be perceived by customers as indicating that the computer system is unreliable, due primarily to the sensitivity of the high-speed memory modules.

It would be desirable if a system could be developed that would provide greater flexibility in modifying timing parameters of memory components based on the occurrence of memory errors. It would also be advantageous if the memory controller was capable of making intelligent decisions regarding memory operating conditions based on the occurrence of memory errors. Despite the apparent advantages such a system would offer, to date no such system is available.

BRIEF SUMMARY OF THE INVENTION

The present invention solves the deficiencies of the prior art by implementing an intelligent memory controller that monitors the number of memory errors detected by error checking and correction (ECC) logic. According to the preferred embodiment, the memory controller preferably includes the capability of adapting the operation of the memory system in response to the occurrence of an excessive number of soft memory errors by changing the frequency of the calibration cycles. If the number and/or frequency of soft memory errors is high, the memory controller increases the calibration frequency to minimize the number and frequency of memory errors. If conversely, the number and frequency of memory errors is very low, the memory controller may decrease the frequency of the calibration cycles to minimize idle time while the calibration cycles are performed.

According to an exemplary embodiment of the present invention, the memory system includes a memory controller that receives signals from ECC logic that indicated the number of memory errors that occur during a defined period. The memory controller uses these input signals from the ECC logic to dynamically determine calibration frequencies, thus adapting quickly to any changes in the environment. If the number of memory errors is low, calibration may not be necessary, and therefore may be deferred to improve memory performance. Conversely, if the number of memory errors is high, a calibration may be scheduled. The calibration periods also may be varied depending on the number of errors over a particular time period.

In the event that multiple memory channels are implemented in the computer system, ECC logic may be provided with each channel to detect the number and frequency of memory errors. Each of the ECC logic devices provide an output signal to a control logic that indicates the number of error detected by each EEC logic device. The control logic monitors these signals from the ECC devices, and modifies the calibration frequency for each memory channel, as necessary, to maintain the number of memory errors within an acceptable level.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device "couples" to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

Figure 1:
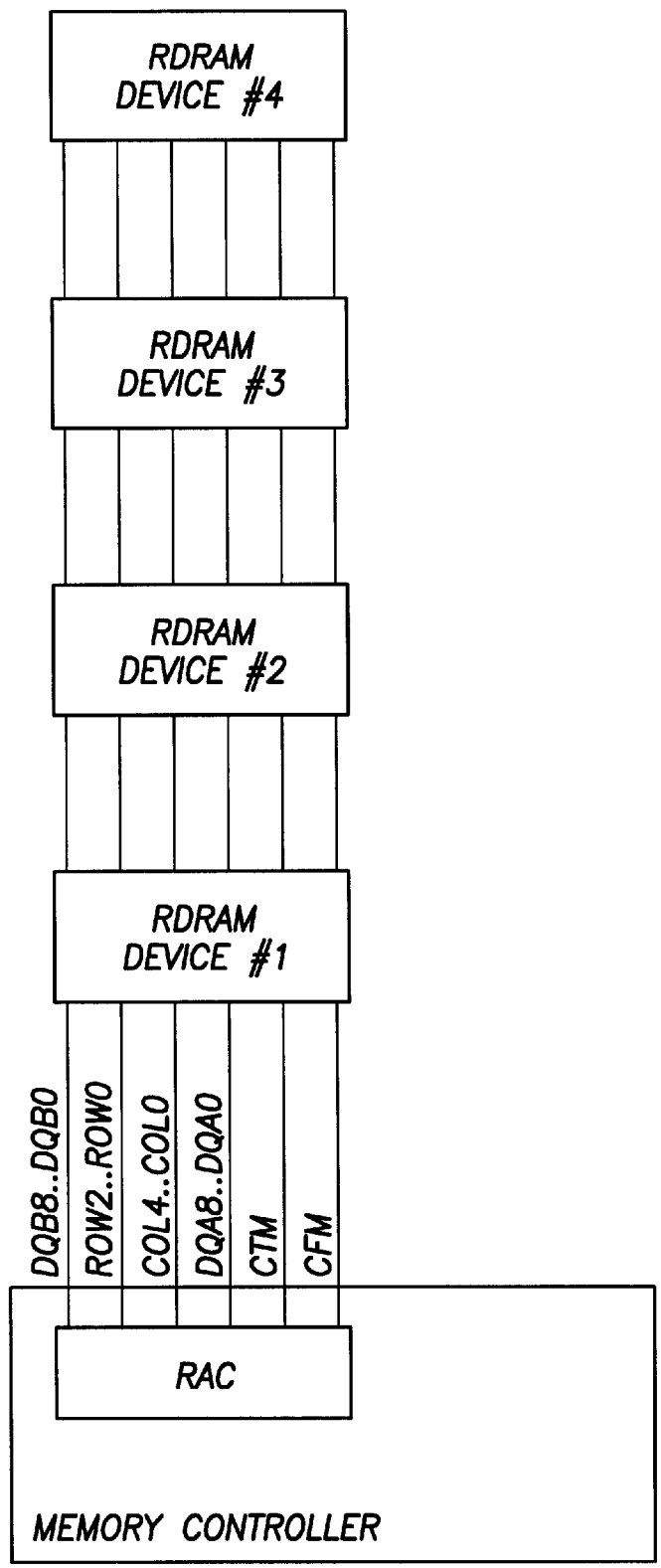
FIG. 1 is a prior art drawing showing the manner in which RDRAM devices couple to a memory controller.
Figure 2:
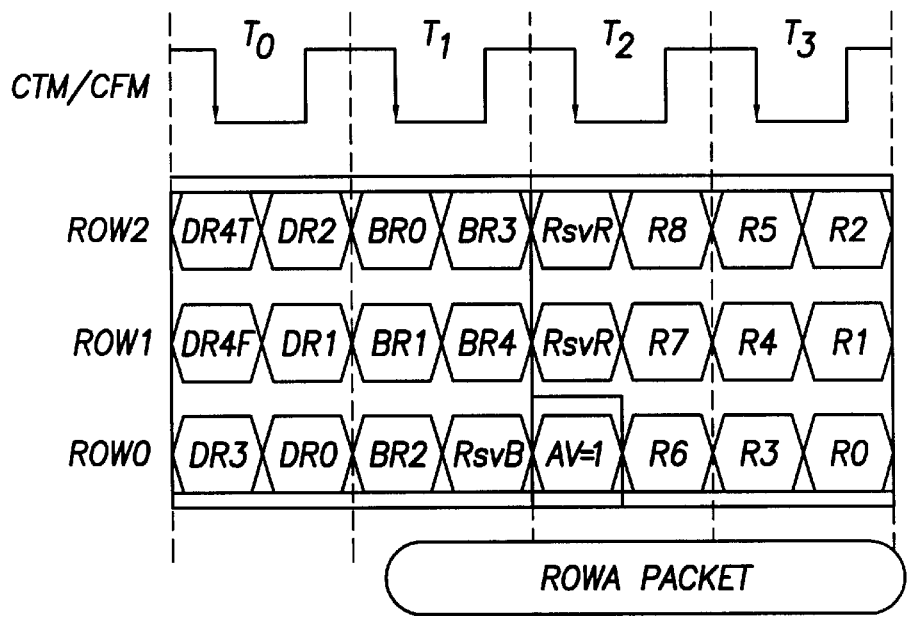
FIG. 2 is a prior art drawing showing a row activate packet for RDRAM devices.
Figure 3:
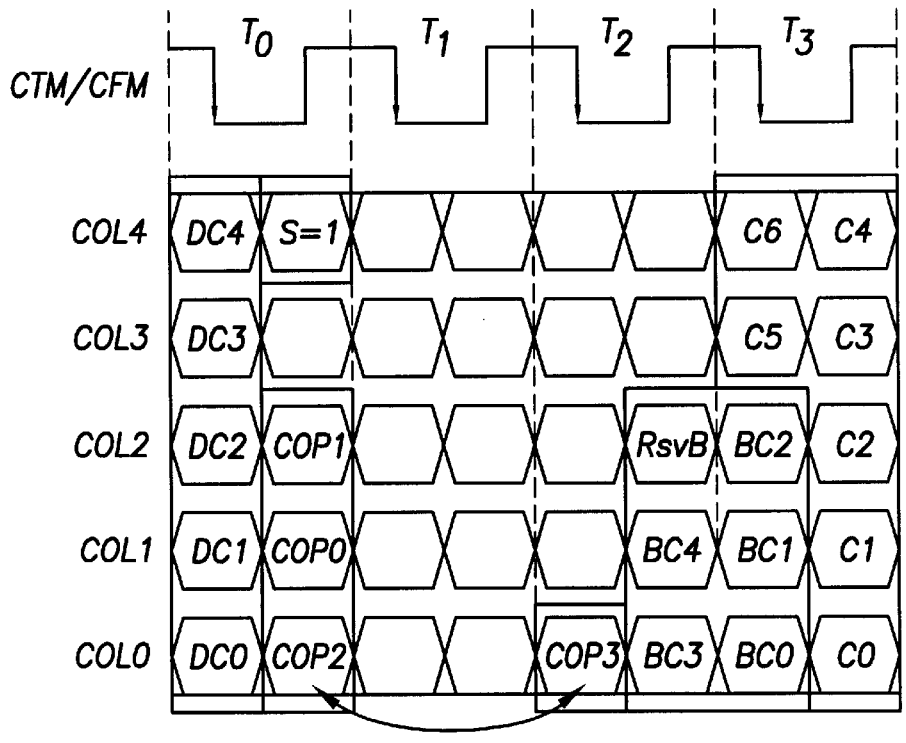
FIG. 3 is a prior art drawing showing a column operation packet for RDRAM devices.
Figure 4:
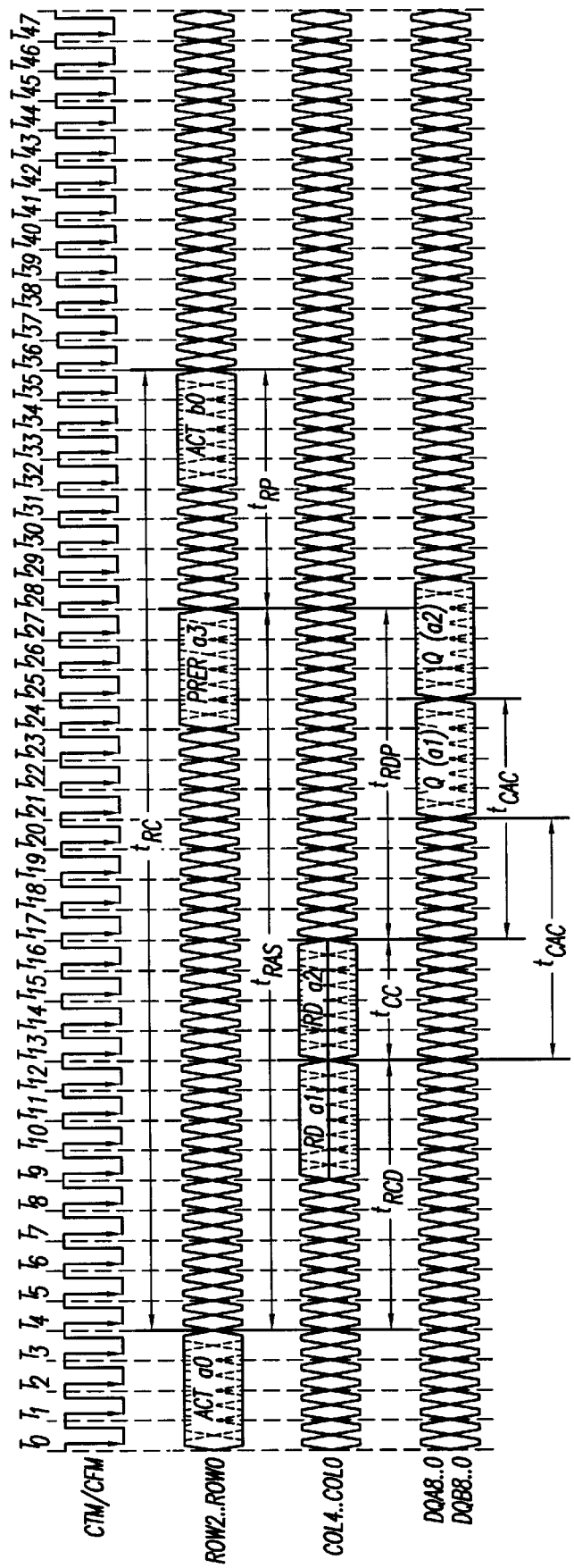
FIG. 4 is a prior art drawing showing a typical timing diagram for a read operation to an RDRAM device.
Figure 5:
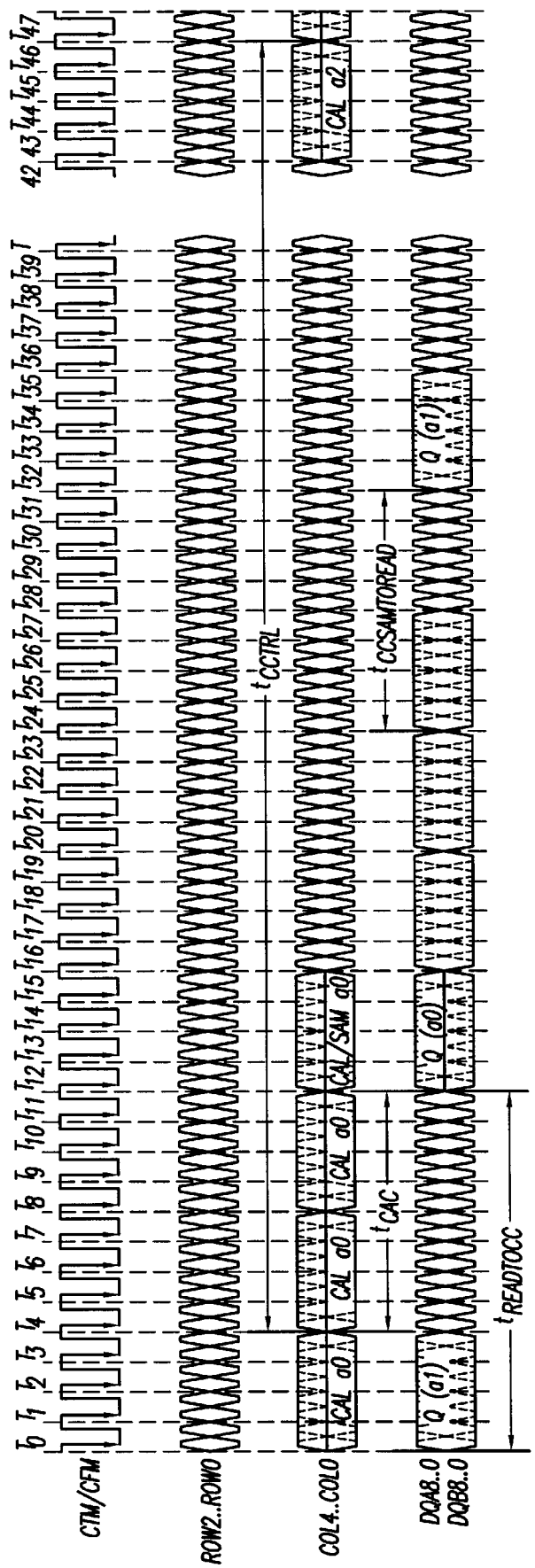
FIG. 5 is a prior art drawing showing a typical current calibration cycles to an RDRAM device.
Figure 6:
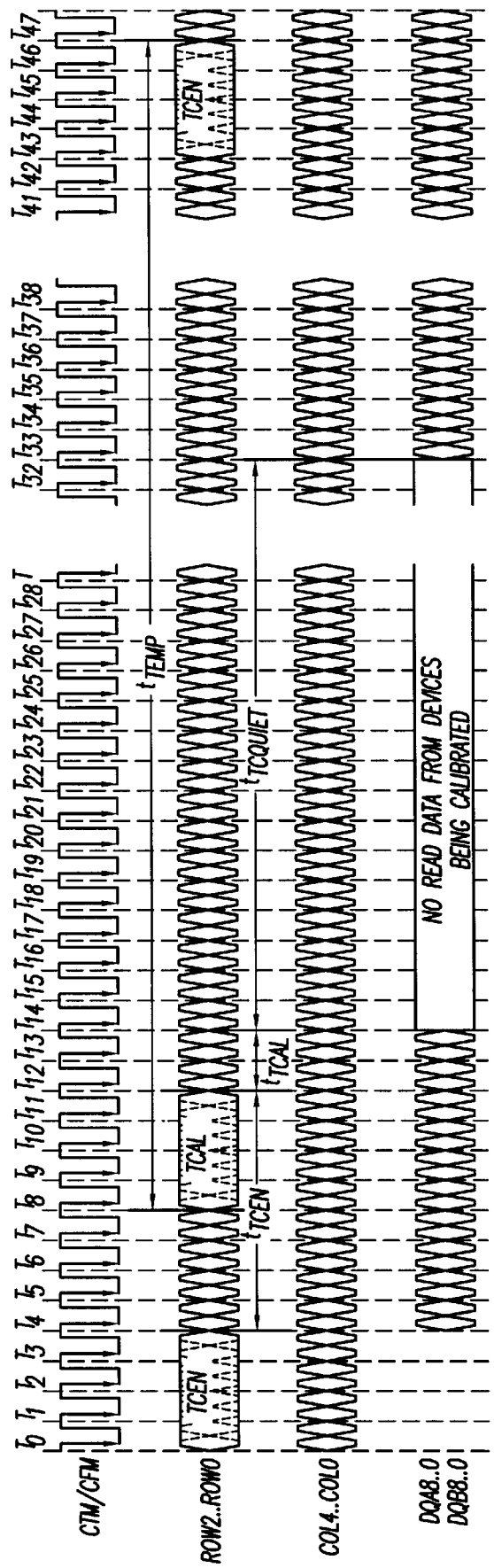
FIG. 6 is a prior art drawing showing a typical temperature calibration cycles to an RDRAM device.
Figure 7:
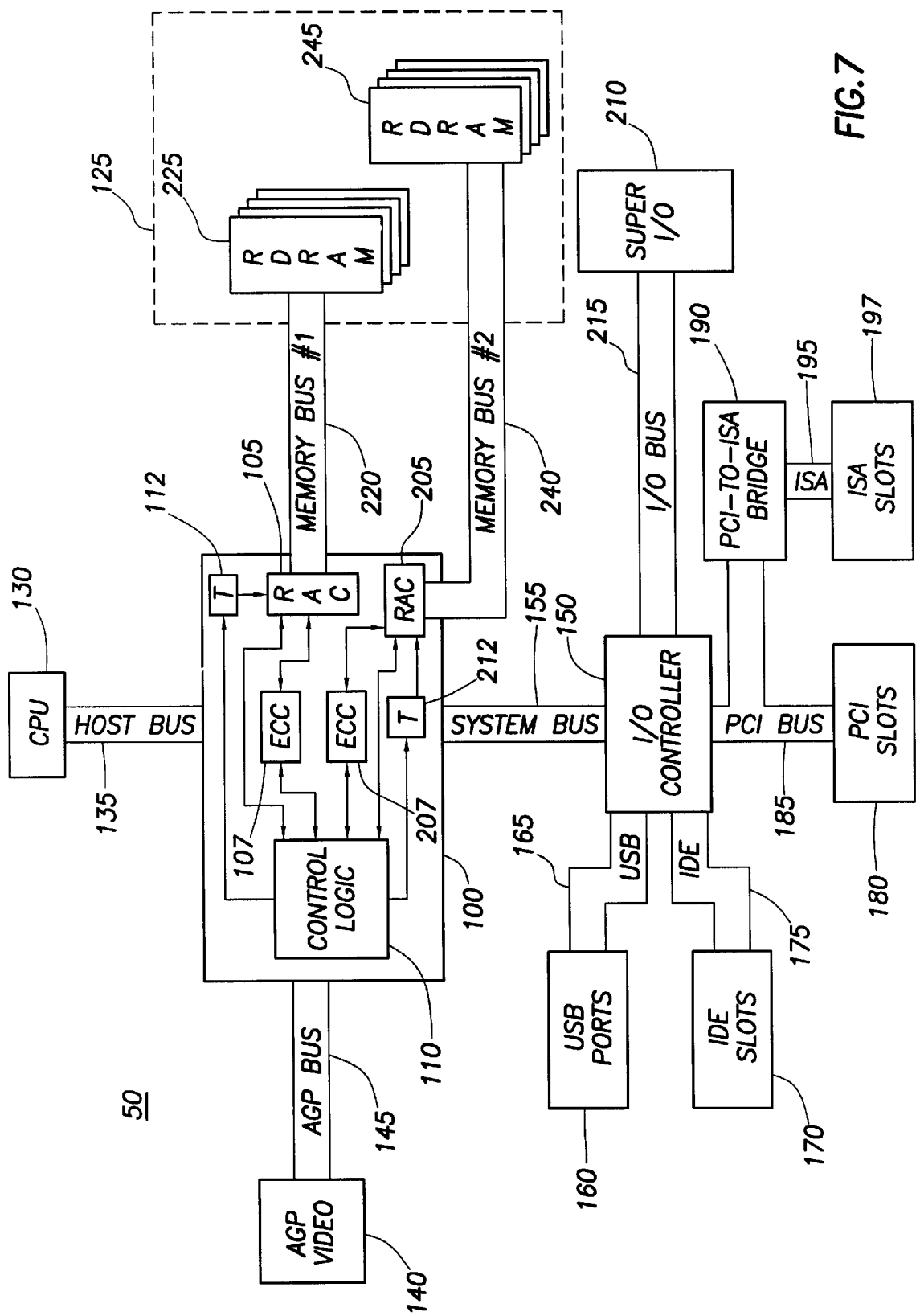
FIG. 7 is a block diagram illustrating an exemplary computer system that includes a multiple channel memory system with ECC logic constructed in accordance with the preferred embodiment.

Referring initially to FIG. 7, a computer system 50 constructed in accordance with the preferred embodiment may comprise a personal computer, a web computer, a server, a workstation, without limitation. Although not shown, the computer system 50 preferably couples via a suitable network connection to a local area network (LAN). As shown in FIG. 7, the computer system 50 preferably implements a standard computer architecture, including a CPU (or processor) 130, system memory 125, a memory controller 100, AGP video controller 140, and I/O controller 150. The processor 130 preferably couples to the memory controller 100 through host bus 135. It should be understood that other embodiments of the invention may include more than one processor or CPU coupled to the host bus. The processor may comprise any suitable microprocessor such as the Pentium II®, Pentium III®, or Celeron® processor by Intel®, the Athlon® processor by AMD, or other microprocessors from these or other manufacturers that may be used or configured for use in a computer system. The system memory 125 preferably comprises one or more memory devices such as any suitable type of random access memory. System memory may comprise, for example, synchronous dynamic random access memory (SDRAM), or other memory designs suitable for use in a computer. According to the preferred embodiment, the system memory 125 comprises Rambus Direct RDRAM memory devices. The capacity of the RDRAM memory devices can be any suitable size. The RDRAM memory devices are arranged in channels that couple separately to the memory controller 100 (two such channels are shown in FIG. 7 for purposes of illustration). Thus, as shown in FIG. 7, RDRAM memory 225 couples via memory bus #1 220 to the memory controller 100, and RDRAM memory 245 couples via memory bus #2 240 to memory controller 100. Within each memory channel, a plurality of RDRAM memory devices may be provided (four RDRAM devices are shown in each channel for purposes of illustration in FIG. 7). Current Rambus specifications support 16 RDRAM memory devices per channel. One or more RDRAM memory devices may be implemented as Ramnbus In-line Memory Modules (RIMMs). The memory controller 100 preferably couples to the RDRAM memory devices in each channel through a conventional Rambus memory bus. A separate memory bus typically is provided for each memory channel, as shown in FIG. 7.

The memory controller 100 permits the processor 130 and other devices in computer system 50 to read data from or write data to system memory 125. As shown in FIG. 7, the memory controller 100 preferably includes an interface to an advanced graphics port (AGP) to support a graphics video controller 140 or other graphics device. According to normal convention, an AGP bus 145 couples the video controller 140 to the memory controller 100. As one skilled in the art will understand, graphics processors or accelerators implementing other protocols also may be used instead of an AGP controller. Typically, a monitor (not shown) couples to the video controller 140.

The memory controller 100 also preferably functions as an interface to a system or peripheral bus 155. In the preferred embodiment, the system bus 155 comprises a high-speed data bus to the I/O controller hub 150. The I/O controller hub 150 bridges the system bus to a variety of peripheral busses, including a USB bus 165, an IDE bus 175, and a PCI bus 185. Coupled to each of these busses are ports or slots that enable compatible devices to be connected to the computer system. Thus, for example, a PCI peripheral device, such as a PCI-compatible network interface card (or NIC) may be inserted into one of the PCI slots 180, for coupling to the I/O controller 150 via the PCI bus 185. In similar fashion, USB devices may be connected to the computer system through one or more USB ports 160, and IDE devices may be connected to the system by inserting the IDE device in an available IDE slot 170. To support legacy ISA devices, a PCI-to-ISA bridge 190 preferably couples to the PCI bus 185. A conventional ISA bus 195 couples ISA slots 197 to the PCI-to-ISA bridge 190. Other devices, such as a modem, audio amplifier, or LAN connection may connect directly to the I/O controller hub 150, or may couple via the conventional peripheral busses.

As shown in FIG. 7, the I/O controller hub 150 preferably couples to a Super I/O controller 210 through an I/O bus 215. The Super I/O device 210 preferably includes conventional ports for coupling to floppy disk drives, a keyboard, and a mouse. Thus, the Super I/O device 210 preferably includes conventional keyboard and mouse controllers for converting user inputs to a traditional format for relaying to the CPU 130. The Super I/O also preferably includes standard parallel and serial ports to permit other peripheral devices to be added to the computer system 50.

According to the preferred embodiment of FIG. 7, the memory controller 100 preferably includes a Rambus ASIC Controller (abbreviated as RAC) 105, 205 for each memory channel. Thus, RAC 105 connects to memory bus #1, while RAC 205 connects to memory bus #2. The RAC orchestrates the transfer of address, data, and control signals between the memory controller 100 and the Direct RDRAM memory devices. Thus, the RACs 105, 205 generate the necessary row (ROW), column (COL), clock (CTM, CFM), and data (DQA, DQB) signals to activate and precharge the memory devices 225, 245, respectively, thereby enabling read, write and other transactions to be performed in these memory devices. The RAC includes an associated timer (T) 112, 212 that indicates the time interval for conducting a temperature calibration and/or a current calibration. When the timer 112 expires, the RAC 105 schedules a temperature calibration and/or a current calibration for RDRAM 225 in accordance with the Rambus specification. Similarly, when timer 212 expires, RAC 205 schedules calibration cycles for RDRAM 245. Although a single timer is shown for each RAC, it should be understood that multiple timers may be provided so that each calibration cycle has it's own associated timer. In addition, the timer may be located within the RAC or any other logic inside or outside memory controller 100. According to the preferred embodiment, the timer 112 is programmable, and the value for the timer can be modified by control logic 110, or by other components in the computer system such as the CPU 130.

Referring still to FIG. 7, the memory controller 100 also preferably includes standard ECC (error checking and correction) logic for monitoring errors within the system memory 125. As shown in FIG. 7, separate ECC logic 107, 207 may be provided for each memory channel. Alternatively, a single ECC logic may be used that is capable of monitoring each memory channel either simultaneously, or on a multiplexing basis. The ECC logic preferably couples to the RAC to check and correct errors that occur in the RDRAM, although error checking logic could be used in the present invention, without correction logic. Thus, as shown in FIG. 7, ECC logic 107 couples to RAC 105 to monitor errors occurring on memory bus #1 and in RDRAM array 225. Similarly, ECC logic 207 couples to RAC 205 to detect errors occurring on memory bus #2 and in RDRAM array 245. The ECC logic devices 107, 207 also couple to control logic 110 to indicate to the control logic the number of errors that occur within a respective channel. Preferably, the control logic 110 also provides a control signal to each RAC 105, 205 to enable the control logic to direct the operation of each RAC unit, and hence, the memory devices on the channel. The memory controller 100 also includes other conventional logic (not shown) for interfacing the CPU 130, video controller 140, I/O controller, and system memory 125, as will be apparent to one skilled in the art.

Although not shown, in accordance with one exemplary embodiment of the invention, a temperature sensor and/or other environmental sensors may be positioned adjacent the RDRAM memory channels 225, 245 to provide the control logic 110 an indication of environmental parameters at, or in the vicinity of, the memory devices.

The ECC logic units 107, 207 preferably detect both soft and hard errors, and continuously indicate the number of soft errors occurring on each channel to the control logic 110. Alternatively, the ECC logic may maintain a count of the memory errors, and periodically indicate the accumulated total, or the total within a particular interval, to the control logic. As yet another alternative, the ECC logic may only provide a signal to the control logic when the number or frequency of soft errors exceeds a predetermined value that may be written into the ECC logic. Thus, the logic for determining whether the number and frequency of memory errors is excessive may be located in the control logic or in the ECC logic, as will be apparent to one skilled in the art.

According to the preferred embodiment, the ECC logic units 107, 207 include registers that store values indicating the number of soft memory errors detected in the associated RDRAM arrays. The control logic 110 periodically performs a read operation to these registers in the ECC logic to identify the number of soft errors for each memory channel. Based on these values, the control logic preferably is programmed to modify the calibration cycles, by changing the value in timers 112, 212 in response to the detection of the memory errors. Thus, if ECC 207 signals the control logic that a large number of soft memory errors have occurred in RDRAM array 245, the control logic 110 may decrease the value in calibration timer 212, thus causing RAC 205 to increase the frequency of the calibration cycles. If the number of errors reaches an acceptable level, the control logic will maintain the calibration timer at this setting. If the number of soft errors is still excessive, the control logic 110 may continue to modify the calibration timer until the minimum possible calibration time has been written into the timer 207. The same operation may proceed substantially simultaneously with timer 112, based on the number and frequency of memory errors detected by ECC 107.

Figure 8:
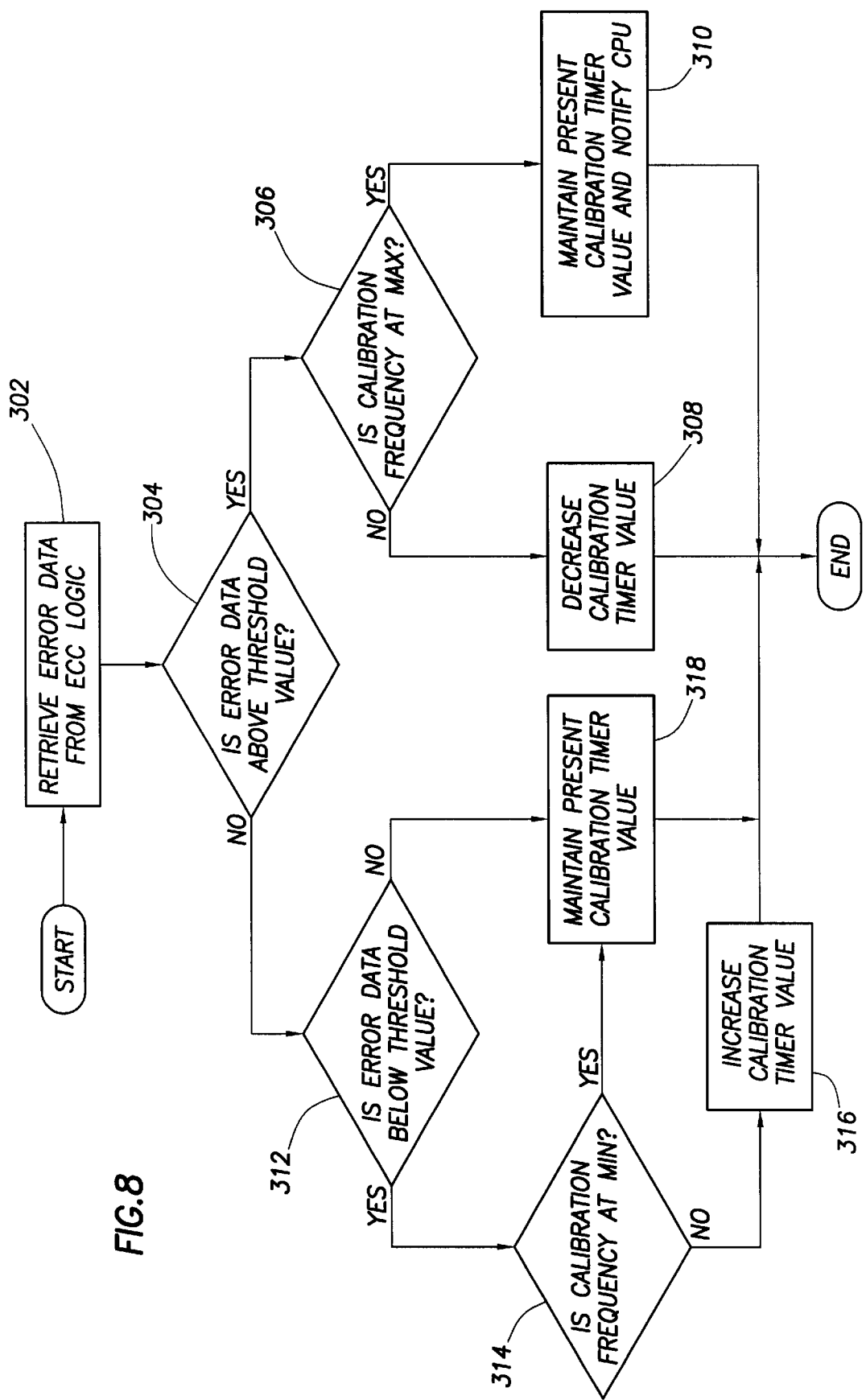
FIG. 8 is a flowchart depicting an exemplary program executed by the control logic of FIG. 7 to determine whether to modify calibration frequency.

An exemplary process for modifying the calibration timer values is depicted in FIG. 8 for purposes of illustration, with the understanding that other flow processes may be used without departing from the spirit of the present invention. The flow logic of FIG. 8 may be run periodically by control logic 110 to determine whether to change the calibration timer values in timers 112, 212. Preferably, the flow logic of FIG. 8 is repeated for each channel, so that the calibration timer values may be changed independently for each channel, based on the number of soft errors occurring in a channel. The flow logic of FIG. 8 may also be performed separately for each calibration timer value, so that a different process is performed to determine if the calibration frequency for a particular calibration cycle may be changed. Thus, for example, the flow logic of FIG. 8 may be executed separately to optimize the timer values for the current calibrations and temperature calibrations. As one skilled in the art will understand, the flow logic of FIG. 8 may be implemented as a state machine, firmware, or as a separately executing program.

According to the preferred embodiment of FIG. 8, the control logic 110 preferably reads error data from a selected ECC logic in step 302. Next (step 304), the control logic determines if the error data is above a threshold value that has been written into the control logic. Alternatively, the control logic may determine the threshold value based on parameters programmed into the control logic. Thus, the control logic may implement any sort of control logic and analyze the error data using proportional, integral and derivative control processes to determine if a threshold value has been exceeded. If a threshold value is exceeded, the control logic then determines if the present calibration timer values are at a maximum frequency value, that may optionally be written in the control logic, as indicated at step 306. If the control logic is programmed with a maximum frequency value, and that value has already been loaded in the calibration timer, then the control logic maintains the calibration timer at the maximum frequency (minimum timer) value and notifies the CPU and/or user that the maximum calibration value setting has been used and an excessive number of soft memory errors are still being detected (step 310). If the calibration timers are below the maximum frequency value, then the calibration timer values are decreased in step 308, thereby increasing the frequency of the calibrations. The frequency values may be increased in incremental fashion, or the control logic 110 may use PID control to change the timer values based on the amount that, and/or frequency with which, the error data exceeds the threshold values.

Returning to decisional block 304, if the control logic determines that the error data is below the upper frequency threshold value, the control logic preferably performs additional steps to determine if the calibration frequency may be decreased. Thus, in step 312, the control logic 312 determines if the number and/or frequency of errors is below a minimum threshold value that may be programmed in control logic 110. If not, the control logic maintains the present calibration timer values, as shown in step 318. If the error data is below the lower frequency threshold value, the control logic determines in step 314 if the present calibration timer value is at the minimum acceptable calibration frequency, as determined by the system designer. If the minimum calibration frequency value has already been loaded in the calibration timer, then the control logic maintains the present calibration timer values, as shown by the branch to step 318. If the error data is below the lower threshold value (step 312), and the calibration timer is not at its minimum frequency value (step 314), the control logic increases the calibration timer value in step 316, thereby decreasing the frequency of the calibration cycle.

The flow chart of FIG. 8 may be modified in many respects and still implement the principles of the present invention. For, example, the flow logic may be implemented to only increase or decrease the calibration timer values. The flow logic may be implemented without minimum and maximum calibration timer values. Further, the flow logic may be designed without triggering threshold value for the system errors, and operate instead as a conventional feedback loop. Moreover, other factors in addition to memory errors may be considered in determining whether to modify the calibration timer values. It should also be noted that the present invention may be used regardless of the number of channels, or RDRAM devices included in the system.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
   a CPU;
   memory control logic coupled to said CPU;
   a system memory coupled to said memory control logic, with said memory control logic controlling and formatting transactions to the system memory;
   error checking logic coupled to said system memory, said error checking logic detecting the number of memory errors that occur in said system memory, and providing a signal to said memory control logic indicating the number of memory errors detected; and
   wherein said memory controller runs calibration cycles to said system memory to recalibrate said system memory, and wherein said memory controller is capable of varying the frequency of said calibration cycles based on the number of memory errors detected by said error checking logic.

2. The system of claim 1, wherein said error checking logic is integrated with said memory control logic.

3. The system of claim 2, wherein said error checking logic further includes error correction logic.

4. The system of claim 1, wherein the calibration cycles comprise a temperature calibration cycle.

5. The system of claim 1, wherein the calibration cycles comprise a current calibration cycle.

6. The system of claim 1, wherein the system memory comprises a plurality of RDRAM devices.

7. The system of claim 6, wherein said system memory is configured into a plurality of memory channels, and wherein separate error checking logic is provided for each memory channel.

8. The system of claim 7, wherein the memory controller logic is capable of independently changing the calibration frequency on a channel-by-channel basis, based on the number of memory errors detected by the error checking logic associated with each channel.

9. The system of claim 8, wherein the memory control logic includes a RAC associated with each memory channel.

10. The system of claim 9, wherein the memory control logic includes at least one calibration timer associated with each RAC, and said memory control logic changes the calibration frequency for each channel by modifying the value of the calibration timer associated with a particular RAC, to thereby modify the calibration frequency of the memory channel associated with that RAC.

11. The system of claim 1, wherein the memory control logic increases the calibration frequency if the number of detected memory errors is above a threshold value.

12. The system of claim 11, wherein the memory control logic decreases the calibration frequency if the number of detected memory errors is below a threshold value.

13. The system of claim 1, wherein the memory control logic decreases the calibration frequency if the number of detected memory errors is below a threshold value.

14. A computer system, comprising:
    a CPU;
    a system memory comprising a plurality of DRAM memory devices coupled to said CPU;
    a memory controller coupling said system memory to said CPU, said memory controller controlling and formatting transactions to the DRAM memory devices, and wherein said memory controller monitors the system memory for memory errors; and
    wherein said memory controller periodically runs calibration cycles to said DRAM memory devices, and wherein said memory controller modifies the frequency of at least one of said calibration cycles in response to detection of said memory errors.

15. The system of claim 14, wherein said high-speed DRAM memory devices comprise Direct RDRAM memory devices.

16. The system of claim 14, wherein the calibration cycles comprise a temperature calibration cycle.

17. The system of claim 14, wherein the calibration cycles comprise a current calibration cycle.

18. The system of claim 14, wherein said memory controller monitors the number of memory errors and modifies the calibration frequency when the number of memory errors exceeds a threshold value.

19. The system of claim 14, wherein said memory controller monitors the number and frequency of memory errors and modifies the calibration frequency when a threshold value is exceeded.

20. The system of claim 14, wherein said memory controller monitors the number of memory errors and modifies the calibration frequency when the number of memory errors is below a threshold value.

21. The system of claim 14, wherein the memory controller monitors the number and frequency of memory errors and modifies the calibration frequency when a threshold error value is not met.

22. The system of claim 14, wherein the memory controller includes error checking logic that detects errors in the system memory, and said memory controller further includes control logic that receives signals from the error checking logic, and in response, changes the calibration frequency.

23. The system of claim 22, wherein the system memory comprises a plurality of RDRAM devices arranged in multiple channels, and wherein error checking logic is associated with each channel.

24. A computer system, comprising:
a CPU;
a memory controller coupled to said CPU;
a video controller coupled to said memory controller;
an I/O controller hub coupled to said memory controller, said I/O controller hub connecting to at least one peripheral bus for coupling to a peripheral device;
a system memory comprised of multiple DRAM memory devices arranged in a plurality of channels, each of which is coupled to said memory controller, with said memory controller controlling and formatting transactions to the DRAM memory devices originating from said CPU and other computer system components, including said peripheral device;
wherein said memory controller runs calibration cycles to said DRAM memory devices to re-calibrate said memory devices, and wherein said memory controller is capable of varying the frequency of said calibration cycles on a channel-by-channel basis based on the number of memory errors that occur in said DRAM memory devices located on a particular channel.

25. The system as in claim 24, wherein said memory controller includes:
error checking logic associated with each channel that detects memory errors that occur during transactions to said memory devices in that channel;
a calibration timer associated with each channel that stores a timer value that determines the frequency of at least one calibration cycle; and
control logic that receives a signal from each of said error checking logic identifying the number of memory errors detected in the associated channel, and in response, is capable of transmitting a signal to the associated calibration timer for that channel to change the timer value stored in said timer.

26. A computer system, comprising:
a CPU;
a memory controller coupled to said CPU;
an I/O controller coupled to said memory controller, said I/O controller connecting to at least one peripheral bus for coupling to a peripheral device;
a system memory comprised of multiple DRAM memory devices arranged in at least one channel that couples to said memory controller, with said memory controller controlling and formatting transactions to the DRAM memory devices originating from said CPU and other computer system components, including said peripheral device;
wherein said memory controller runs calibration cycles to said DRAM memory devices to re-calibrate said memory devices, and wherein said memory controller is capable of varying the frequency of said calibration cycles based on the number of errors that occur during transactions to said DRAM memory devices.

27. The system as in claim 26, wherein said memory controller includes:
error checking logic that detects memory errors that occur during transactions to said memory devices;
a calibration timer that stores a timer value that determines the frequency of at least one calibration cycle; and
control logic that receives a signal from said error checking logic identifying the number of memory errors detected, and in response, is capable of transmitting a signal to said calibration timer to change the timer value stored in said timer.

28. A method of modifying the frequency of a calibration cycle in a memory controller, comprising:
detecting the number of memory errors that occur in a memory channel;
determining if the number of memory errors exceeds a predetermined threshold value; and
increasing the frequency of the calibration cycle if the number of memory errors exceeds the threshold value.

29. A method as in claim 28, further comprising:
determining if the number of memory errors is below a second threshold value; and
decreasing the frequency of the calibration cycle if the number of memory errors is below the second threshold value.

30. A method as in claim 29, wherein the frequency of the calibration cycle is only decreased down to a minimum frequency value.

31. A method as in claim 29, wherein the act of decreasing the frequency of the calibration cycle includes increasing a timer value stored in a calibration timer.

32. A method as in claim 28, wherein the frequency of the calibration cycle is only increased up to a maximum frequency value.

33. A method as in claim 28, wherein the act of increasing the frequency of the calibration cycle includes decreasing a timer value stored in a calibration timer.

* * * * *